United States Patent
Do et al.

(10) Patent No.: US 7,923,846 B2
(45) Date of Patent: Apr. 12, 2011

(54) INTEGRATED CIRCUIT PACKAGE-IN-PACKAGE SYSTEM WITH WIRE-IN-FILM ENCAPSULANT

(75) Inventors: Byung Tai Do, Singapore (SG); Seng Guan Chow, Singapore (SG); Heap Hoe Kuan, Singapore (SG); Linda Pei Ee Chua, Singapore (SG); Rui Huang, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 400 days.

(21) Appl. No.: 12/121,752

(22) Filed: May 15, 2008

(65) Prior Publication Data
US 2009/0127680 A1 May 21, 2009

Related U.S. Application Data

(60) Provisional application No. 60/988,724, filed on Nov. 16, 2007.

(51) Int. Cl.
*H01L 23/48* (2006.01)
(52) U.S. Cl. .......... 257/777; 257/E23.085; 257/E23.087
(58) Field of Classification Search .......... 257/676, 257/686, 777, 787, 796, E23.085, E23.087
See application file for complete search history.

(56) References Cited

U.S. PATENT DOCUMENTS

| | | | |
|---|---|---|---|
| 6,455,941 B1 | 9/2002 | Lee et al. | |
| 7,049,691 B2 | 5/2006 | Karnezos | |
| 7,332,372 B2 | 2/2008 | Derderian | |
| 7,482,686 B2 * | 1/2009 | Zhao et al. | 257/710 |
| 7,501,693 B2 | 3/2009 | Chu et al. | |
| 7,598,606 B2 * | 10/2009 | Chow et al. | 257/686 |
| 7,629,677 B2 * | 12/2009 | Youn et al. | 257/676 |
| 2005/0205996 A1 | 9/2005 | Usui et al. | |
| 2006/0102989 A1 | 5/2006 | Lee et al. | |
| 2006/0197207 A1 | 9/2006 | Chow et al. | |
| 2006/0275952 A1 | 12/2006 | Gowda et al. | |
| 2007/0108621 A1 | 5/2007 | Park | |
| 2007/0200248 A1 | 8/2007 | Ong | |
| 2007/0278696 A1 | 12/2007 | Lu et al. | |
| 2008/0017972 A1 | 1/2008 | Bauer et al. | |

FOREIGN PATENT DOCUMENTS

| | | |
|---|---|---|
| JP | 61-158153 A | 7/1986 |
| JP | 2001-018330 A | 1/2001 |
| JP | 2003-100807 A | 4/2003 |
| WO | 2006/054473 A1 | 5/2006 |

* cited by examiner

*Primary Examiner* — Quoc D Hoang
(74) *Attorney, Agent, or Firm* — Mikio Ishimaru

(57) ABSTRACT

A multiple encapsulation integrated circuit package-in-package system includes: dicing a top integrated circuit wafer having a bottom encapsulant thereon to form a top integrated circuit die with the bottom encapsulant; positioning internal leadfingers adjacent and connected to a bottom integrated circuit die; pressing the bottom encapsulant on to the bottom integrated circuit die; connecting the top integrated circuit die to external leadfingers adjacent the internal leadfingers; and forming a top encapsulant over the top integrated circuit die.

9 Claims, 9 Drawing Sheets

INTEGRATED CIRCUIT PACKAGE-IN-PACKAGE SYSTEM WITH WIRE-IN-FILM ENCAPSULANT

TECHNICAL FIELD

The present invention relates generally to integrated circuit package systems, and more particularly to a bond wire interconnected package-in-package system.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Multi-chip devices can be fabricated faster and more cheaply than a corresponding single integrated circuit, which incorporates the same or different functions. Current multi-chip module construction typically consists of a printed circuit board substrate to which a series of separate components are directly attached. This technology is advantageous because of the increase in circuit density achieved.

With increased density comes improvement in signal propagation speed and overall device weight required for the consumer electronics application, such as in cellular phones, and personal digital assistance (PDA). While integrated circuit density increases at a significant rate, the interconnection density has become a significant limiting factor in the quest for miniaturization. Key features that are required in the minimization are high density circuit packing, low cost, reliable interconnect methodology and small package profiles.

For applications such as cell phones, which require integration of a digital base band or digital signal processor (DSP) and an analog device, the strongest stacked package solutions are package-in-package (PiP) and package-on-package (PoP) systems.

The package-in-package system is a three dimensional (3D) package technology in which separately assembled and tested packages and bare dies/chips are stacked together in a single chip scale package for exceptional integration flexibility and functional density in a smaller footprint. The footprint reflects what is typically the maximum dimension of the package, namely, the x-y dimension of the package in the horizontal plane.

Electronic circuits in a package-in-package configuration, include a semiconductor element or a semiconductor chip which is mechanically attached and electrically connected to an element carrier, such as a substrate, generally together with further electronic components. An inner contact-connection is led from the element carrier to a leadframe. The encapsulated active component, the element carrier, the inner contact-connection and the leadframe are in turn enclosed with one another into a housing, such as a molding compound or an encapsulant.

In a package-in-package system, the interconnection between the stacked integrated circuit dies is typically done by using wire bonds or solder bumps. The manufacturing process for the package-in-package system is complicated by the molding encapsulation process, which is applied to protect the packages that form the package-in-package system and the wire bonding interconnection between the integrated circuit dies.

Due to the coefficient of thermal expansion (CTE) mismatch between the semiconductor chip and the substrate, the electrical interconnects are subjected to shear stresses during operation which cause them to fail prematurely. Such failures may be avoided by the effective reduction of stress on the electrical interconnect.

Despite the advantages of recent developments in integrated circuit and integrated circuit package manufacturing, there is a continuing need for improving integrated circuit device and integrated circuit package connectivity to provide improved dimensional size of available space and as well as integrity, manufacturing yield, and product reliability.

Thus, a need still remains for finding a solution to simplify the three dimensional package manufacturing process, to reduce the package size and provide improved encapsulation process while protecting the electrical interconnections, such as bond wires, from sweeping. In view of the ever-increasing need to minimize the size and the total height of the stacked package system, it is increasingly critical that answers be found to these problems.

Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a multiple encapsulation integrated circuit package-in-package system that includes: dicing a top integrated circuit wafer having a bottom encapsulant thereon to form a top integrated circuit die with the bottom encapsulant; positioning internal leadfingers adjacent and connected to a bottom integrated circuit die; pressing the bottom encapsulant on to the bottom integrated circuit die; connecting the top integrated circuit die to external leadfingers adjacent the internal leadfingers; and forming a top encapsulant over the top integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
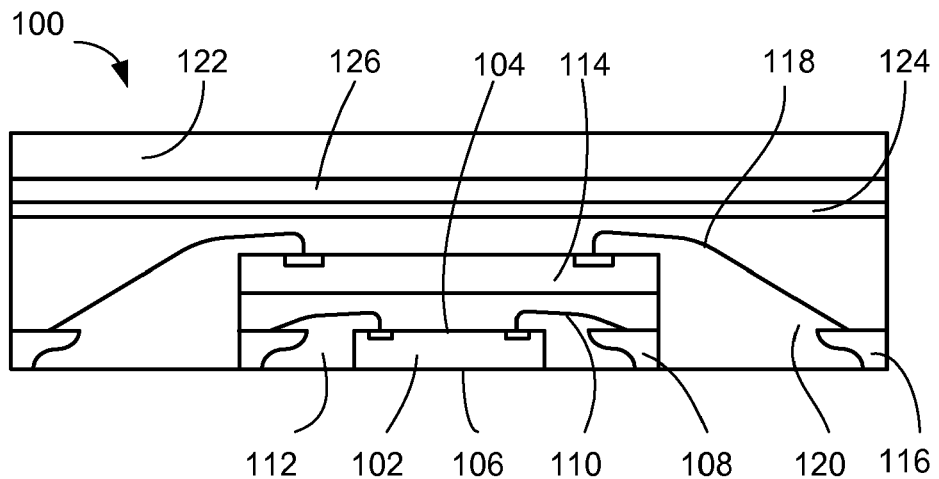
FIG. 1 is a cross-sectional view of a multiple encapsulation integrated circuit package-in-package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used.

Referring now to FIG. 1, therein is shown a cross-sectional view of a multiple encapsulation integrated circuit package-in-package system 100 in a first embodiment of the present invention.

The multiple encapsulation integrated circuit package-in-package system 100 includes a bottom integrated circuit die 102 having an active side 104 and a non-active side 106. The active side 104 of the bottom integrated circuit die 102 is electrically connected to internal leadfingers 108 using bottom die electrical interconnects 110, such as bond wires.

The internal leadfingers 108 are placed around the periphery of the bottom integrated circuit die 102. The internal leadfingers 108 can be of any shape and cross-section, such as T shape, trapezoid, L shape, etc, that enhances mechanical locking effect with a bottom encapsulant, such as an internal wire-in-film encapsulant 112.

The internal wire-in-film encapsulant 112 encapsulates the bottom integrated circuit die 102, the internal leadfingers 108, and the bottom die electrical interconnects 110.

The internal wire-in-film encapsulant 112 is a material which can be molded over the bottom integrated circuit die 102, the bottom die electrical interconnects 110, and the internal leadfingers 108 in such a way that the material flows around the bottom integrated circuit die 102, the internal leadfingers 108, and the bottom die electrical interconnects 110.

It has been discovered that the internal wire-in-film encapsulant 112 can bond on to the underside of the bottom integrated circuit die 102 without the need for an intervening adhesive. The internal wire-in-film encapsulant 112 can also adhere to and surround the bottom die electrical interconnects 110, and to at least a portion of the underside of the internal leadfingers 108.

The internal wire-in-film encapsulant 112 has a low viscosity and, as temperature increases, the viscosity gets lower. Therefore, the internal wire-in-film encapsulant 112 can be easily pressed, in a heated state, over the bottom integrated circuit die 102, the internal leadfingers 108, and the bottom die electrical interconnects 110.

The internal wire-in-film encapsulant 112 can be a B-stage material that can be hardened after curing and can maintain a predetermined thickness. It should also be a good thermal interface material.

A top integrated circuit die 114 is attached above the bottom integrated circuit die 102 using the internal wire-in-film encapsulant 112 as a thermal interface material and as a die-attach adhesive.

The top integrated circuit die 114 is electrically connected to external leadfingers 116 using top die electrical interconnects 118, such as bond wires. The external leadfingers 116 are placed around the periphery of the internal leadfingers 108.

The external leadfingers 116 can be of any shape and cross-section, such as T shape, trapezoid, L shape, etc, that enhances mechanical locking effect with a top encapsulant, such as an external wire-in-film encapsulant 120.

The external wire-in-film encapsulant 120 is similar to or the same as the internal wire-in-film encapsulant 112 and may be easily pressed over the top integrated circuit die 114, the external leadfingers 116, and the top die electrical interconnects 118 for protection.

The external wire-in-film encapsulant 120 may also be used as a thermal interface material and adhesive for attaching a stiffener 122. The stiffener 122 may be made of organic, metal, ceramic or other material, which is stiff enough to act as a support for the external wire-in-film encapsulant 120 in its uncured or viscous state. When the stiffener 122 is made by thermal or electrical conductive material, it can function as heat sink or electromagnetic interference shielding layer.

The stiffener 122 is attached to the external wire-in-film encapsulant 120 with a buffer layer 124 having an adhesive layer 126 above the buffer layer 124. The buffer layer 124 is used to compensate for the coefficient of thermal expansion mismatch between the external wire-in-film encapsulant 120 and the adhesive layer 126. It is preferable that the buffer layer 124 is made of an insulation material.

Since the stiffener 122 is used to stiffen the external wire-in-film encapsulant 120 during the encapsulation step, the stiffener 122 may be removed as an option after curing of the external wire-in-film encapsulant 120.

It is also an option to fully or partially embed the internal leadfingers 108 and the external leadfingers 116 into the internal wire-in-film encapsulant 112 and the external wire-in-film encapsulant 120.

The multiple encapsulation integrated circuit package-in-package system 100 is formed with the bottom integrated circuit die 102 together with the internal leadfingers 108 and the internal wire-in-film encapsulant 112 forming an integrated circuit package inside the top integrated circuit die 114 together with the external leadfingers 116 and the external wire-in-film encapsulant 120 forming another integrated circuit package.

It has also been discovered that encapsulating the bottom integrated circuit die 102 with the internal wire-in-film encapsulant 112 and the top integrated circuit die 114 with the external wire-in-film encapsulant 120, the manufacturing process may be improved since the same type of encapsulation material can be used for encapsulating both dies and therefore it may lead to cost reduction in manufacturing the multiple encapsulation integrated circuit package-in-package system 100.

Using the internal wire-in-film encapsulant 112 both as an encapsulant and as a thermal interface material it improves manufacturing yield and reduces cost of the multiple encapsulation integrated circuit package-in-package system 100 by simplifying and reducing the manufacturing process.

The cross-sectional view of the multiple encapsulation integrated circuit package-in-package system 100 shows two integrated circuit dies vertically stacked, although it is understood that more than two integrated circuit dies or integrated circuit packages may be vertically stacked as well.

The multiple encapsulation integrated circuit package-in-package system 100 can have package marking on either the side with the external wire-in-film encapsulant 120 or the stiffener 122.

Figure 2:
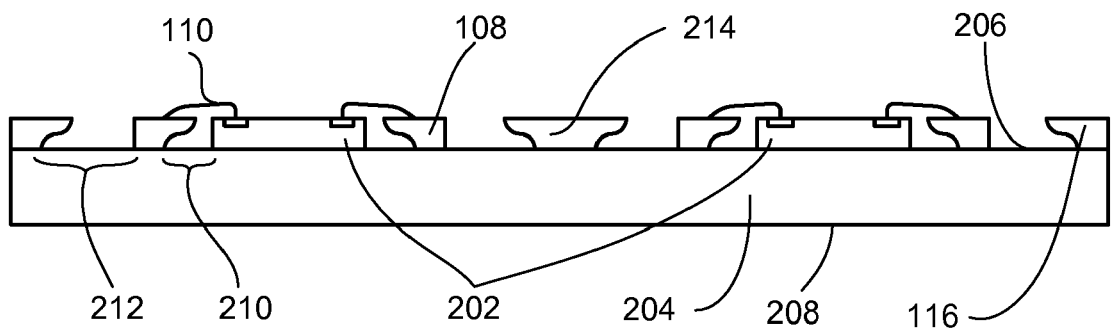
FIG. 2 is the structure of FIG. 1 in an intermediate mounting step of manufacture in the first embodiment of the present invention.

Referring now to FIG. 2, therein is shown the structure of FIG. 1 in an intermediate mounting step of manufacture in the first embodiment of the present invention.

Bottom integrated circuit dies 202 are positioned on a carrier, such as a provisional chip carrier 204. The provisional chip carrier 204, having a top surface 206 and a bottom surface 208, can be a dummy silicon wafer, metal foil, or any other temporary chip carrier.

The internal leadfingers 108 are mounted at the periphery of the bottom integrated circuit dies 202 such that a first space 210 is kept between the bottom integrated circuit dies 202 and the internal leadfingers 108. The internal leadfingers 108 are electrically connected to the bottom integrated circuit dies 202 using the bottom die electrical interconnects 110, such as wire bonds.

The external leadfingers 116 are mounted at the periphery of the internal leadfingers 108 such that a second space 212 is kept between the internal leadfingers 108 and the external leadfingers 116.

The external leadfingers 116 are merged together in positions other than the outer edges of the provisional chip carrier 204 to form dual external leadfingers 214.

Figure 3:
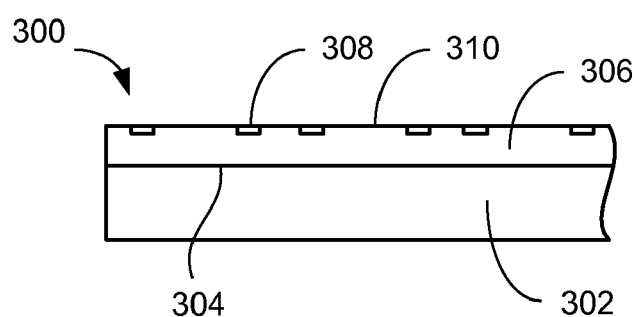
FIG. 3 is a cross-sectional view of formation of a first encapsulant backed wafer.

Referring now to FIG. 3, therein a cross-sectional view of formation of a first encapsulant backed wafer 300.

An internal wire-in-film encapsulant 302 is bonded on to a backside 304 of an integrated circuit wafer 306 to form the first encapsulant backed wafer 300. The internal wire-in-film encapsulant 302 is made of a B-stage material that is soft enough during an uncured state to be pressed over fine bond wires to encapsulate them without deforming them but can be hardened after curing to maintain a predetermined thickness and hold the fine bond wires in place.

The integrated circuit wafer 306 has bond pads 308 on an active side 310 thereof.

Figure 4:
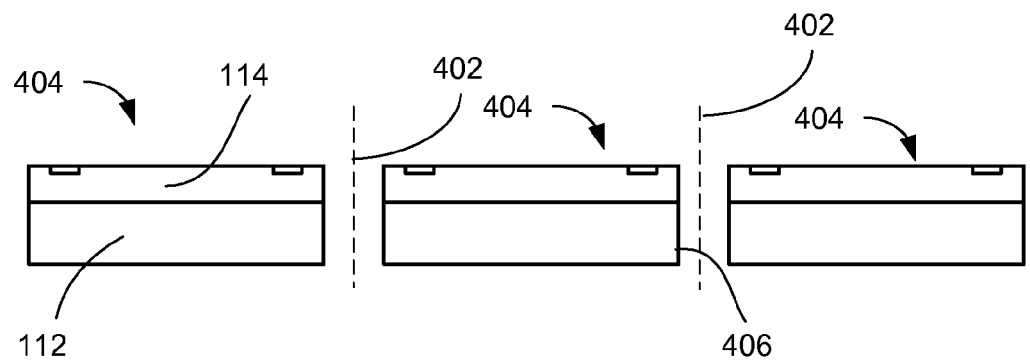
FIG. 4 is the structure of FIG. 3 in a dicing step of manufacture.

Referring now to FIG. 4, therein is shown the structure of FIG. 3 in a dicing step of manufacture.

The first encapsulant backed wafer 300 is diced along dicing lines 402 to form first die stacks 404. The dicing can be preformed by a number of methods, which include the use of saws, lasers, etc. This allows the first die stacks 404 to have vertical sides 406, which are characteristic of being formed by a dicing process.

The first die stacks 404 are formed of the internal wire-in-film encapsulant 112 attached to the bottom of the top integrated circuit die 114.

Figure 5:
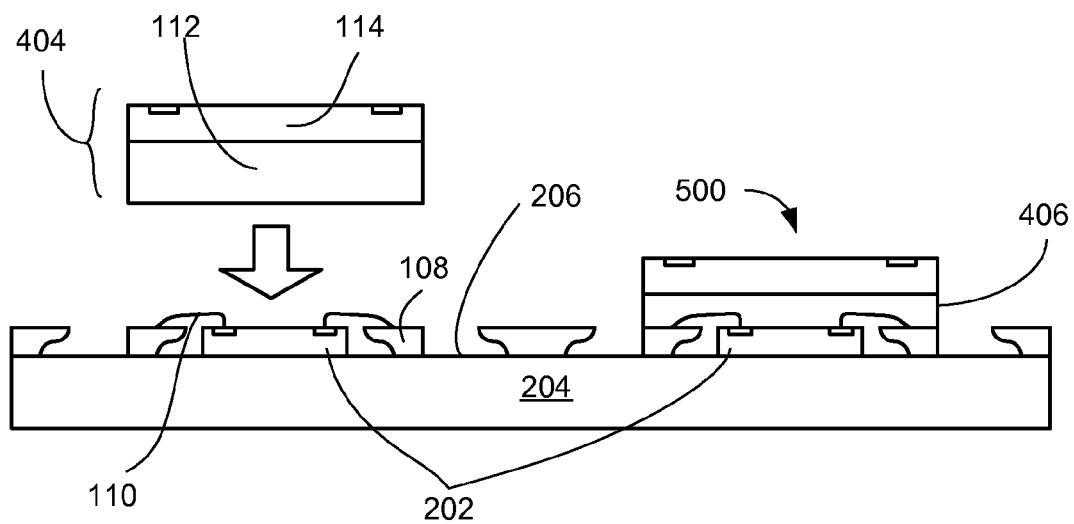
FIG. 5 is the structure of FIG. 2 during a first encapsulation step with the structure of FIG. 4.

Referring now to FIG. 5, therein is shown the structures of FIG. 3 and FIG. 4 in an encapsulation step of manufacture.

The first die stack 404 is pressed down over and encapsulates the bottom integrated circuit die 202, the internal leadfingers 108, and the bottom die electrical interconnects 110 about to the top surface 206 of the provisional chip carrier 204. This forms a bottom package 500 with the vertical sides 406.

The internal wire-in-film encapsulant 112 has a low viscosity and, as temperature increases, the viscosity gets lower. Therefore, the internal wire-in-film encapsulant 112 can be easily pressed over the bottom integrated circuit dies 202, the internal leadfingers 108, and the bottom die electrical interconnects 110 and cured to provide an encapsulation.

Figure 6:
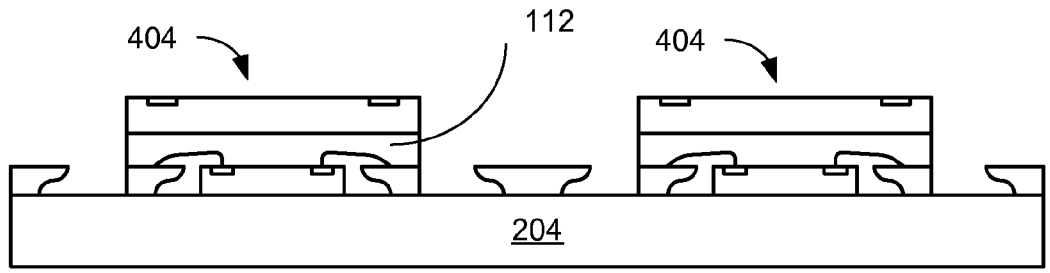
FIG. 6 is the structure of FIG. 5 in a first encapsulant curing step of manufacture.

Referring now to FIG. 6, therein is shown the structure of FIG. 5 in an encapsulant curing step of manufacture.

The internal wire-in-film encapsulant 112 is cured through a post mold cure process.

Figure 7:
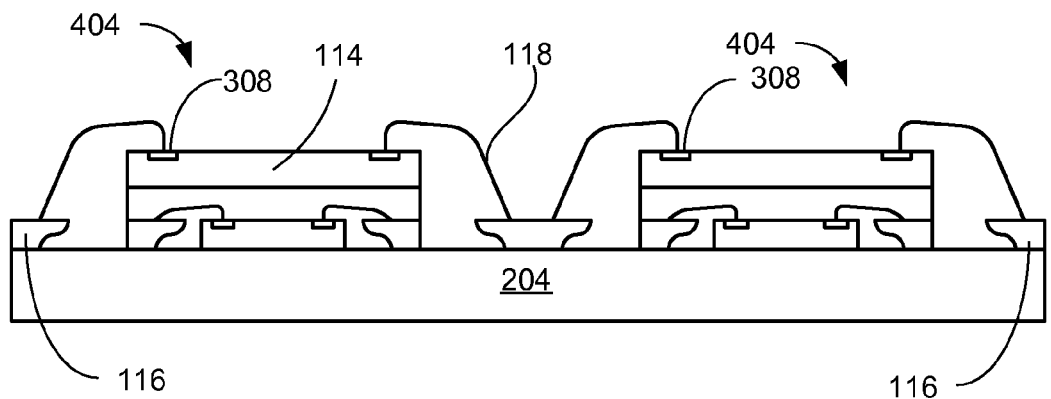
FIG. 7 is the structure of FIG. 6 in a second wire bonding step of manufacture.

Referring now to FIG. 7, therein is shown the structure of FIG. 6 in a wire bonding step of manufacture.

The top die electrical interconnects 118, such as wire bonds, are used to electrically couple the bond pads 308 on the top integrated circuit die 114 to the external leadfingers 116.

Figure 8:
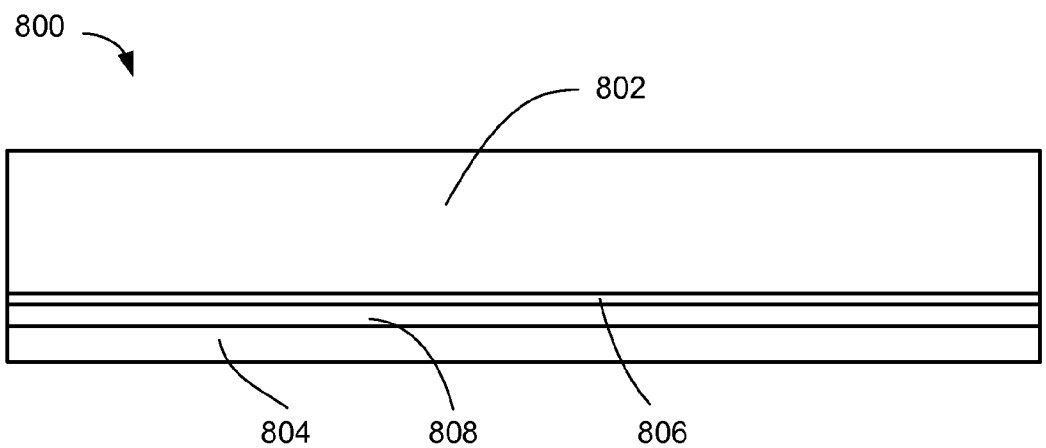
FIG. 8 is a cross-sectional view of formation of a second stack in a stacking step of manufacture.

Referring now to FIG. 8, therein is shown a cross-sectional view of a second stack 800 in a stacking step of manufacture.

A stiffener 804 has an adhesive layer 808 deposited thereon followed by a buffer layer 806 and an external wire-in-film encapsulant 802. The external wire-in-film encapsulant 802 can be the same or similar material as the internal wire-in-film encapsulant 112.

Figure 9:
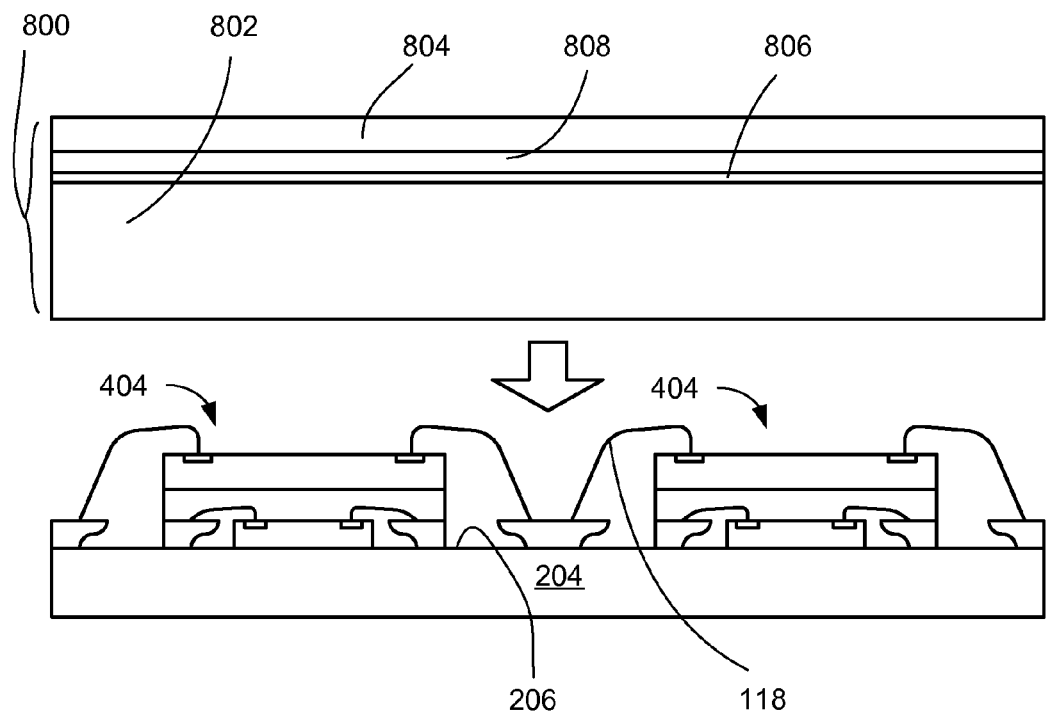
FIG. 9 is the structure of FIG. 8 being pressed over the structure of FIG. 7 in an encapsulation attachment step of manufacture.

Referring now to FIG. 9, therein is shown the structure of FIG. 8 being pressed over the structure of FIG. 7 in an encapsulation attachment step of manufacture.

The second stack 800 is inverted and pressed down over and encapsulates the first die stacks 404, the top die electrical interconnects 118, and the external leadfingers 116 about to the top surface 206 of the provisional chip carrier 204.

Figure 10:
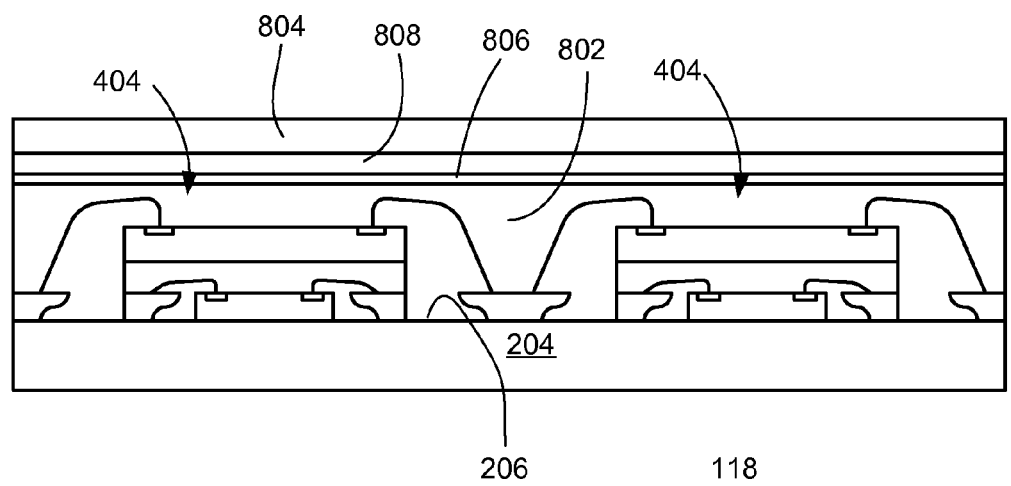
FIG. 10 is the structure of FIG. 9 in a second encapsulant curing step of manufacture.

Referring now to FIG. 10, therein is shown the structure of FIG. 9 in a second encapsulant curing step of manufacture.

The external wire-in-film encapsulant 802 is cured in a post mold cure process.

Figure 11:
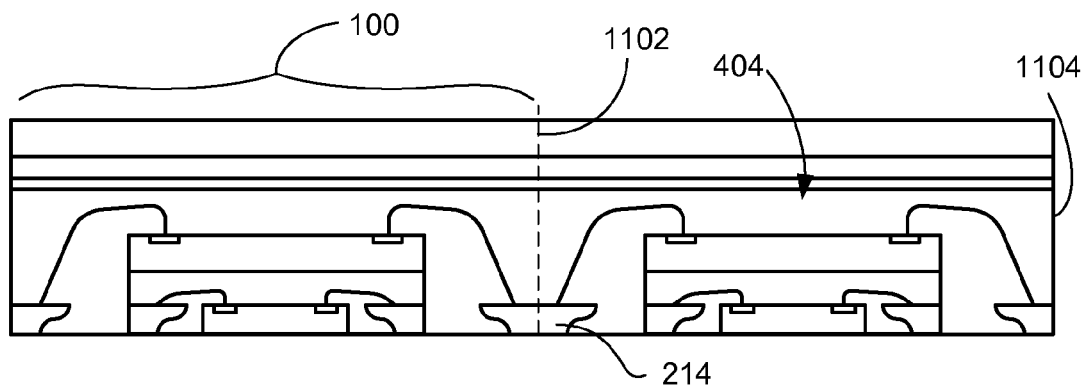
FIG. 11 is the structure of FIG. 10 in a dicing step of manufacture.

Referring now to FIG. 11, therein is shown the structure of FIG. 10 in a dicing step of manufacture.

The provisional chip carrier 204 is removed and structure of FIG. 10 is diced along a dicing line 1102 and the dual external leadfingers 214 are sliced in half to form the multiple encapsulation integrated circuit package-in-package system 100. The dicing can be preformed by a number of methods, which include the use of saws, lasers, etc. This allows the multiple encapsulation integrated circuit package-in-package system 100 to have vertical sides 1104, which are characteristic of being formed by a dicing process.

Figure 12:
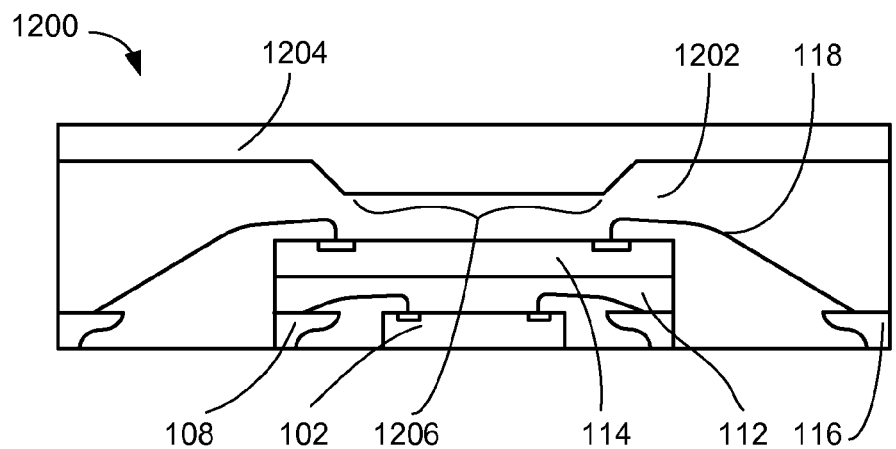
FIG. 12 is a cross-sectional view of a multiple encapsulation integrated circuit package-in-package system in a second embodiment of the present invention.

Referring now to FIG. 12, therein is shown a cross-sectional view of a multiple encapsulation integrated circuit package-in-package system 1200 in a second embodiment of the present invention.

An external wire-in-film encapsulant 1202 encapsulates and protects the top integrated circuit die 114, the top die electrical interconnects 118, and the external leadfingers 116. The external wire-in-film encapsulant 1202 may also be used as a thermal interface material for attaching a heat sink 1204. Thus, the external wire-in-film encapsulant 1202 serves both as an encapsulant to protect the top integrated circuit die 114, the top die electrical interconnects 118, and the external leadfingers 116 and as a thermal interface material to attach the heat sink 1204.

The internal wire-in-film encapsulant 112 and the external wire-in-film encapsulant 1202 are made of a B-stage material that is soft enough during an uncured state to be pressed over fine bond wires to encapsulate them without deforming them but can be hardened after curing to maintain a predetermined thickness and hold the fine bond wires in place.

The heat sink 1204 having a protrusion 1206 is mounted above the external wire-in-film encapsulant 1202. The protrusion 1206 is placed in close proximity with the top integrated circuit die 114 to enhance thermal transfer from the top integrated circuit die 114 to the heat sink 1204 while maintaining a clearance between the top die electrical interconnects 118 and the heat sink 1204.

It has been found that the top integrated circuit die 114 can be replaced by a known good package (KGP) such as an internal stacking module (ISM), an interposer, a pre-molded package, or any combination of them.

It is an option for the bottom integrated circuit die 102 to be replaced by a pre-tested internal stacking module (ISM), pre-molded package, or any combination of them.

It has also been found that it is an option to use a flip chip integrated circuit die as an interconnection method to form electrical connection between the bottom integrated circuit die 102 and the top integrated circuit die 114 or between the bottom integrated circuit die 102 and the internal leadfingers 108, or between the top integrated circuit die 114 and the external leadfingers 116.

Figure 13:
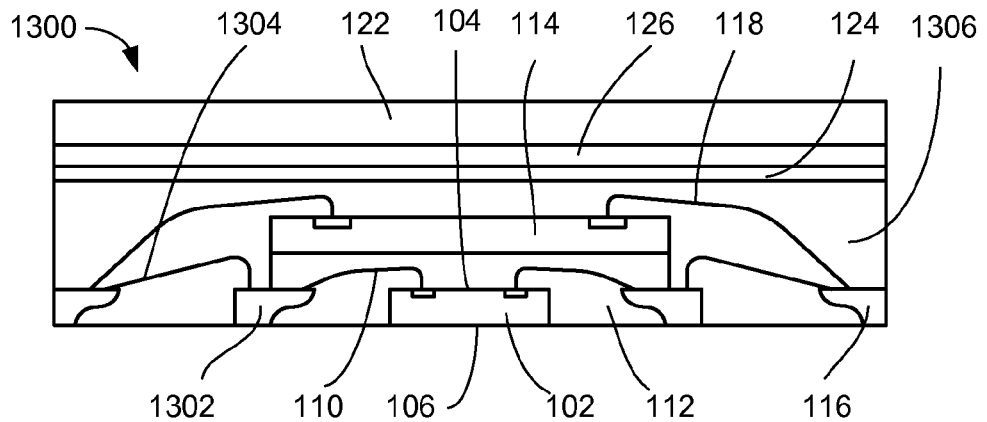
FIG. 13 is a cross-sectional view of a multiple encapsulation integrated circuit package-in-package system in a third embodiment of the present invention.

Referring now to FIG. 13, therein is shown a cross-sectional view of a multiple encapsulation integrated circuit package-in-package system 1300 in a third embodiment of the present invention.

The multiple encapsulation integrated circuit package-in-package system 1300 includes the bottom integrated circuit die 102 having the active side 104 and the non-active side 106. The active side 104 of the bottom integrated circuit die 102 is electrically connected to extended internal leadfingers 1302 using the bottom die electrical interconnects 110. The extended internal leadfingers 1302 are placed around the periphery of the bottom integrated circuit die 102 and extend outward from the internal wire-in-film encapsulant 112.

The internal wire-in-film encapsulant 112 encapsulates the bottom integrated circuit die 102, the bottom die electrical interconnects 110, and partially encapsulates the extended internal leadfingers 1302. The internal wire-in-film encapsulant 112 is made of a B-stage material that is soft enough during an uncured state to be pressed over fine bond wires to encapsulate them without deforming them but can be hardened after curing to maintain a predetermined thickness and hold the fine bond wires in place.

The side electrical interconnects 1304, such as bond wires, are used to provide electrical interconnection between the outward extension of the extended internal leadfingers 1302 and the external leadfingers 116.

The top integrated circuit die 114 is attached above the internal wire-in-film encapsulant 112. The top integrated circuit die 114 is electrically connected to the external leadfingers 116 using the top die electrical interconnects 118, such as bond wires. The external leadfingers 116 are placed around the periphery of the extended internal leadfingers 1302.

An external wire-in-film encapsulant 1306 encapsulates and protects the top integrated circuit die 114, the top die electrical interconnects 118, the side electrical interconnects 1304, the external leadfingers 116, and partially the extended internal leadfingers 1302.

The internal wire-in-film encapsulant 112 and the external wire-in-film encapsulant 1306 are made of a B-stage material that is soft enough during an uncured state to be pressed over fine bond wires to encapsulate them without deforming them but can be hardened after curing to maintain a predetermined thickness and hold the fine bond wires in place.

The external wire-in-film encapsulant 1306 may also be used as a thermal interface material for attaching the stiffener 122. Thus, the external wire-in-film encapsulant 1306 serves both as an encapsulant to protect the top integrated circuit die 114, the top die electrical interconnects 118, the side electrical interconnects 1304, and the external leadfingers 116 and it serves as a thermal interface material to attach the stiffener 122.

The buffer layer 124 is placed above the external wire-in-film encapsulant 1306 and the adhesive layer 126 is placed above the buffer layer 124. The stiffener 122 is then placed above the adhesive layer 126. The stiffener 122 may be made of organic, metal, ceramic or other material, which is stiff enough to act as a support for the external wire-in-film encapsulant 1306 in its uncured or viscous state. When the stiffener 122 is made by thermal or electrical conductive material, it can function as heat sink or electromagnetic interference shielding layer.

Figure 14:
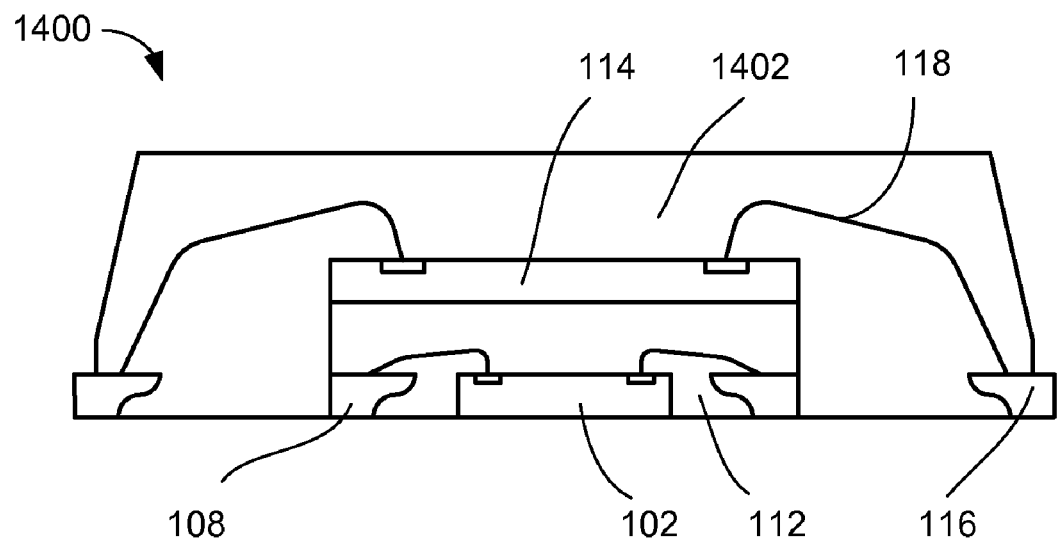
FIG. 14 is a cross-sectional view of a multiple encapsulation integrated circuit package-in-package system in a fourth embodiment of the present invention.

Referring now to FIG. 14, therein is shown a cross-sectional view of a multiple encapsulation integrated circuit package-in-package system 1400 in a fourth embodiment of the present invention.

The multiple encapsulation integrated circuit package-in-package system 1400, such as a quad flat no-lead (QFN) integrated circuit package, is encapsulated using a top encapsulant, such as a mold encapsulant 1402. The mold encapsulant 1402 encapsulates and protects the top integrated circuit die 114 and the top die electrical interconnects 118 while partially encapsulating the external leadfingers 116. The mold encapsulant 1402 also surrounds the internal leadfingers 108 and the internal wire-in-film encapsulant 112.

The mold encapsulant 1402 is generally a composite material consisting of epoxy resins, phenolic hardeners, silicas, catalysts, pigments, etc.

It has also been discovered that the multiple encapsulation integrated circuit package-in-package system 1400 can have other lead configurations, such as quad flat pack (QFP), exposed quad flat pack (QFP-ep), etc.

Figure 15:
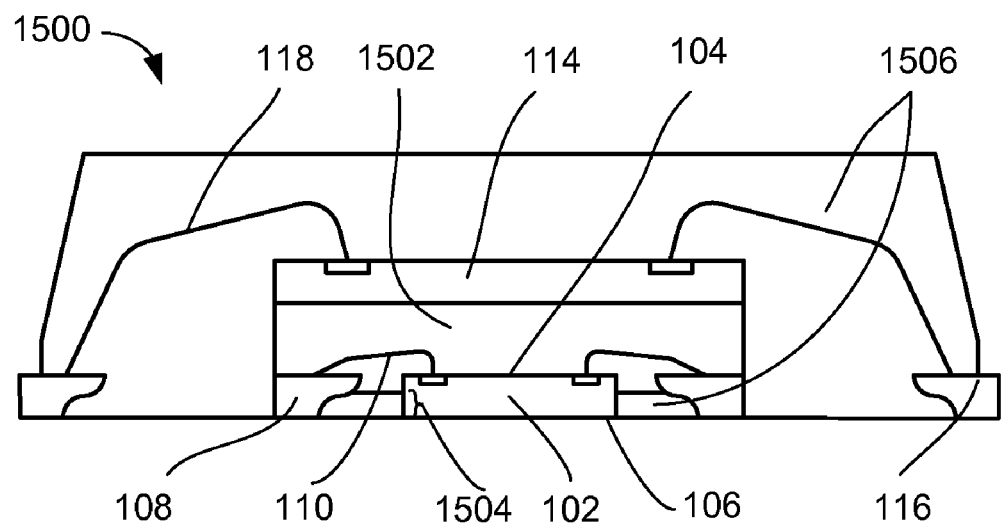
FIG. 15 is a cross-sectional view of a multiple encapsulation integrated circuit package-in-package system in a fifth embodiment of the present invention.

Referring now to FIG. 15, therein is shown a cross-sectional view of a multiple encapsulation integrated circuit package-in-package system 1500 in a fifth embodiment of the present invention.

The cross-sectional view of the multiple encapsulation integrated circuit package-in-package system 1500, such as a quad flat no-lead (QFN) integrated circuit package, includes the bottom integrated circuit die 102 having the active side 104 and the non-active side 106. The active side 104 of the bottom integrated circuit die 102 is electrically connected to the internal leadfingers 108 using the bottom die electrical interconnects 110. The internal leadfingers 108 are placed around the periphery of the bottom integrated circuit die 102.

An internal wire-in-film encapsulant 1502 is pressed down over the bottom die electrical interconnects 110 and partially down over the bottom integrated circuit die 102 and the internal leadfingers 108, such that a clearance 1504 is maintained between the bottom of the internal wire-in-film encapsulant 1502 and the bottom of the internal leadfingers 108.

The top integrated circuit die 114 is attached above the internal wire-in-film encapsulant 1502. The top integrated circuit die 114 is electrically connected to the external leadfingers 116 using the top die electrical interconnects 118, such as bond wires. The external leadfingers 116 are placed around the periphery of the internal leadfingers 108.

A mold encapsulant 1506 encapsulates the top integrated circuit die 114 and the top die electrical interconnects 118 while filling the clearance 1504. By filling the clearance 1504, the remaining portion of the bottom integrated circuit die 102 and the internal leadfingers 108 are embedded in the mold encapsulant 1506. The mold encapsulant 1506 only partially encapsulates the external leadfingers 116.

The bottom integrated circuit die 102, and the internal leadfingers 108 are only partially embedded in the internal wire-in-film encapsulant 1502.

It has been discovered that the multiple encapsulation integrated circuit package-in-package system 1500 can have other lead configurations, such as quad flat pack, exposed quad flat pack, etc.

Figure 16:
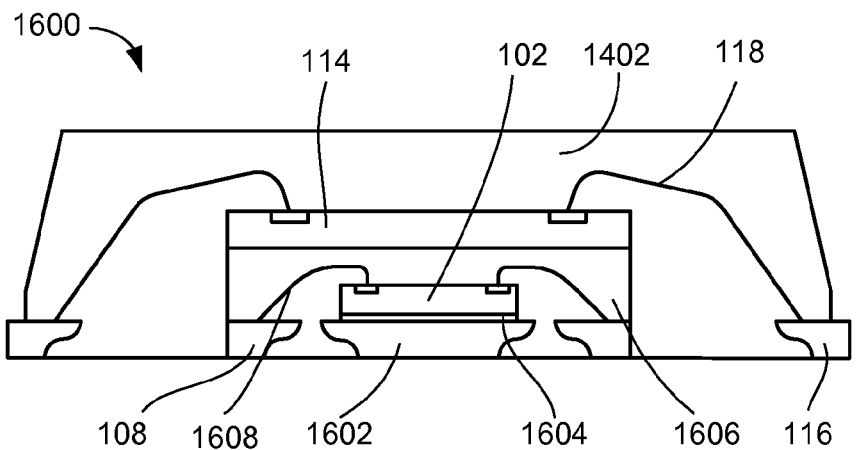
FIG. 16 is a cross-sectional view of a multiple encapsulation integrated circuit package-in-package system in a sixth embodiment of the present invention.

Referring now to FIG. 16, therein is shown a cross-sectional view of a multiple encapsulation integrated circuit package-in-package system 1600 in a sixth embodiment of the present invention.

The multiple encapsulation integrated circuit package-in-package system 1600, such as a quad flat no-lead (QFN) integrated circuit package, includes the bottom integrated circuit die 102 attached above a die attach paddle 1602 using a first attachment material 1604, such as a die-attach adhesive.

The die attach paddle 1602, in combination with the first attachment material 1604 can produce a thermally efficient combination which removes heat from the bottom integrated circuit die 102.

An internal wire-in-film encapsulant 1606 encapsulates the bottom integrated circuit die 102, the internal leadfingers 108, bottom die electrical interconnects 1608, and the die attach paddle 1602.

The internal wire-in-film encapsulant 1606 has a low viscosity and, as temperature increases, the viscosity gets lower. Therefore, the internal wire-in-film encapsulant 1606 can be pressed over the bottom integrated circuit die 102, the internal leadfingers 108, the bottom die electrical interconnects 1608, and around the die attach paddle 1602.

The internal wire-in-film encapsulant 1606 is made of a B-stage material that can be hardened after curing and can maintain a predetermined thickness.

It has been discovered that the thickness of the internal wire-in-film encapsulant 1606 is at least 20 μm (microns) over the loop height of the bottom die electrical interconnects 1608.

The top integrated circuit die 114 is attached above the internal wire-in-film encapsulant 1606. The top integrated circuit die 114 is electrically connected to the external leadfingers 116 using the top die electrical interconnects 118, such as bond wires. The external leadfingers 116 are placed around the periphery of the internal leadfingers 108.

The mold encapsulant 1402 encapsulates the top integrated circuit die 114 and the top die electrical interconnects 118 while partially encapsulating the external leadfingers 116. The mold encapsulant 1402 surrounds the internal leadfingers 108 and the internal wire-in-film encapsulant 1606 while leaving the external leadfingers 116 partially exposed.

It has been discovered that the multiple encapsulation integrated circuit package-in-package system 1600 can have other lead configurations, such as quad flat package, exposed quad flat package, etc.

Figure 17:
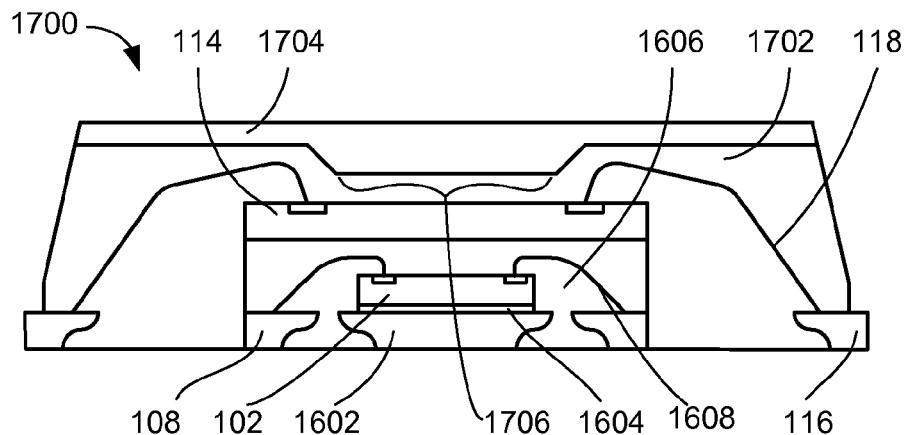
FIG. 17 is a cross-sectional view of a multiple encapsulation integrated circuit package-in-package system in a seventh embodiment of the present invention.

Referring now to FIG. 17, therein is shown a cross-sectional view of a multiple encapsulation integrated circuit package-in-package system 1700 in a seventh embodiment of the present invention.

The multiple encapsulation integrated circuit package-in-package system 1600, such as a quad flat no-lead (QFN) integrated circuit package, includes the bottom integrated circuit die 102 attached above the die attach paddle 1602 using the first attachment material 1604.

The die attach paddle 1602, in combination with the first attachment material 1604 can produce a thermally efficient combination which removes heat from the bottom integrated circuit die 102.

The internal wire-in-film encapsulant 1606 encapsulates the bottom integrated circuit die 102, the internal leadfingers 108, the bottom die electrical interconnects 1608, and the die attach paddle 1602.

The internal wire-in-film encapsulant 1606 has a low viscosity and, as temperature increases, the viscosity gets lower. Therefore, the internal wire-in-film encapsulant 1606 can be pressed over the bottom integrated circuit die 102, the internal leadfingers 108, the bottom die electrical interconnects 1608, and around the die attach paddle 1602.

The internal wire-in-film encapsulant 1606 is made of a B-stage material that can be hardened after curing and can maintain a predetermined thickness.

It has been discovered that the thickness of the internal wire-in-film encapsulant 1606 is at least 20 μm (microns) over the loop height of the bottom die electrical interconnects 1608.

The top integrated circuit die 114 is attached above the internal wire-in-film encapsulant 1606. The top integrated circuit die 114 is electrically connected to the external leadfingers 116 using the top die electrical interconnects 118, such as bond wires. The external leadfingers 116 are placed around the periphery of the internal leadfingers 108.

A mold encapsulant 1702 encapsulates the top integrated circuit die 114 and the top die electrical interconnects 118 while partially encapsulating the external leadfingers 116. The mold encapsulant 1702 surrounds the internal leadfingers 108 and the internal wire-in-film encapsulant 1606 while leaving the external leadfingers 116 partially exposed.

A heat sink 1704 having a protrusion 1706 is mounted above the mold encapsulant 1702. The protrusion 1706 is placed in close proximity with the top integrated circuit die 114 to enhance thermal transfer from the top integrated circuit die 114 to the heat sink 1704 while maintaining a clearance between the top die electrical interconnects 118 and the heat sink 1704.

It has been discovered that the multiple encapsulation integrated circuit package-in-package system 1700 can have other lead configurations, such as quad flat package, exposed quad flat package, etc.

Figure 18:
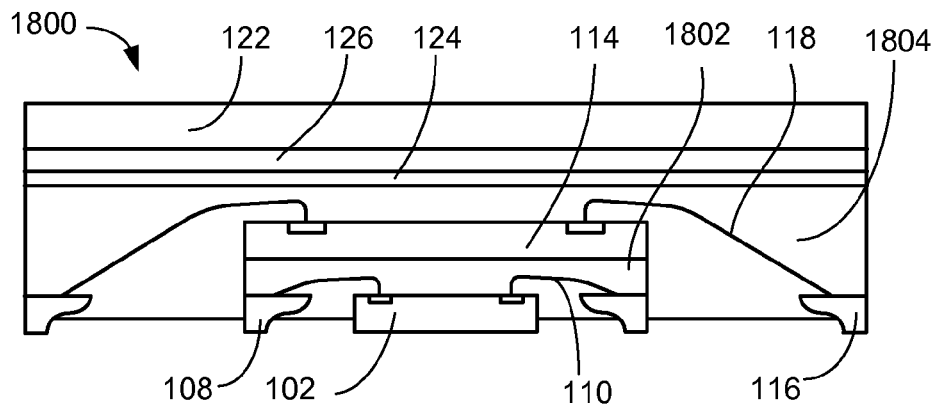
FIG. 18 is a cross-sectional view of a multiple encapsulation integrated circuit package-in-package system in an eighth embodiment of the present invention.

Referring now to FIG. 18, therein is shown a cross-sectional view of a multiple encapsulation integrated circuit package-in-package system 1800 in an eighth embodiment of the present invention.

An internal wire-in-film encapsulant 1802 encapsulates the bottom die electrical interconnects 110, and partially encapsulates the bottom integrated circuit die 102 and the internal leadfingers 108 leaving the bottom integrated circuit die 102 and the internal leadfingers 108 protruding from the bottom of the internal wire-in-film encapsulant 1802.

The internal wire-in-film encapsulant 1802 is made of a B-stage material that is soft enough during an uncured state to be pressed over fine bond wires to encapsulate them without deforming them but can be hardened after curing to maintain a predetermined thickness and hold the fine bond wires in place.

It has been discovered that the thickness of the internal wire-in-film encapsulant 1802 is at least 20 μm (microns) over the loop height of the bottom die electrical interconnects 110.

The top integrated circuit die 114 is attached above the internal wire-in-film encapsulant 1802. The top integrated circuit die 114 is electrically connected to the external leadfingers 116 using the top die electrical interconnects 118, such as bond wires. The external leadfingers 116 are placed around the periphery of the internal leadfingers 108.

An external wire-in-film encapsulant 1804 encapsulates and protects the top integrated circuit die 114, the top die electrical interconnects 118, and the external leadfingers 116. The external wire-in-film encapsulant 1804 may also be used as a thermal interface material for attaching the stiffener 122. Thus, the external wire-in-film encapsulant 1804 serves both as an encapsulant to protect the top integrated circuit die 114, the top die electrical interconnects 118, and the external leadfingers 116 and as a thermal interface material to attach the stiffener 122.

The buffer layer 124 and the adhesive layer 126 are attached above the external wire-in-film encapsulant 1804. The buffer layer 124 may be used to compensate for the coefficient of thermal expansion mismatch between the adhesive layer 126 and the external wire-in-film encapsulant 1804. It is preferable that the buffer layer 124 is made of an insulation material.

The stiffener layer 122 is also used as a support during the manufacturing of the multiple encapsulation integrated circuit package-in-package system 1800 or to strengthen the structure of the multiple encapsulation integrated circuit package-in-package system 1800.

The adhesive layer 126 can be applied on top of the buffer layer 124 to promote adhesion to the stiffener 122.

The bottom integrated circuit die 102, the internal leadfingers 108, and the external leadfingers 116 protrude downward from the internal wire-in-film encapsulant 1802 and the external wire-in-film encapsulant 1804 to provide better wettability during bonding to a printed circuit board (not shown). This exposure can be achieved by controlling how much the external wire-in-film encapsulant 1804 and the internal wire-in-film encapsulant 1802 should be pressed down or by etching a back copper leadframe.

Figure 19:
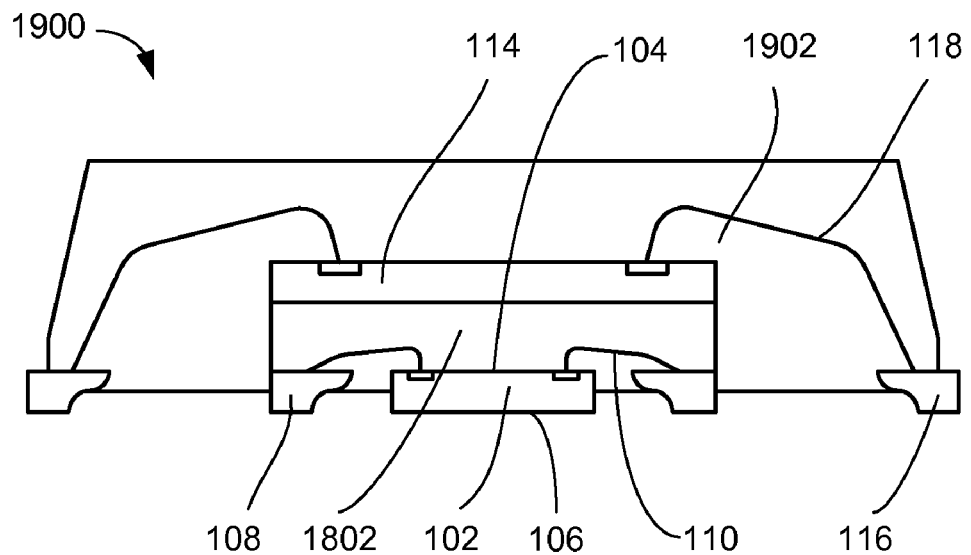
FIG. 19 is a cross-sectional view of a multiple encapsulation integrated circuit package-in-package system in a ninth embodiment of the present invention.

Referring now to FIG. 19, therein is shown a cross-sectional view of a multiple encapsulation integrated circuit package-in-package system 1900 in a ninth embodiment of the present invention.

The internal wire-in-film encapsulant 1802 encapsulates the bottom die electrical interconnects 110, and partially encapsulates the bottom integrated circuit die 102 and the internal leadfingers 108.

The internal wire-in-film encapsulant 1802 has a low viscosity and, as temperature increases, the viscosity gets lower. Therefore, the internal wire-in-film encapsulant 1802 can be easily pressed over the bottom die electrical interconnects 110 and partially pressed over the bottom integrated circuit die 102 and the internal leadfingers 108.

The top integrated circuit die 114 is attached above the internal wire-in-film encapsulant 1802 and is electrically connected to the external leadfingers 116 using the top die electrical interconnects 118. The external leadfingers 116 are placed around the periphery of the internal leadfingers 108.

A mold encapsulant 1902 encapsulates the top integrated circuit die 114 and the top die electrical interconnects 118 while partially encapsulating the external leadfingers 116. The mold encapsulant 1902 surrounds the internal wire-in-film encapsulant 1802 while leaving the internal leadfingers 108 and the external leadfingers 116 partially exposed.

The bottom integrated circuit die 102, the internal leadfingers 108, and the external leadfingers 116 protrude downward from the internal wire-in-film encapsulant 1802 and the mold encapsulant 1902 to provide better wettability during bonding to a printed circuit board (not shown). This exposure can be achieved by controlling how much the mold encapsulant 1902 and the internal wire-in-film encapsulant 1802 should be pressed down or by etching a back copper leadframe.

Figure 20:
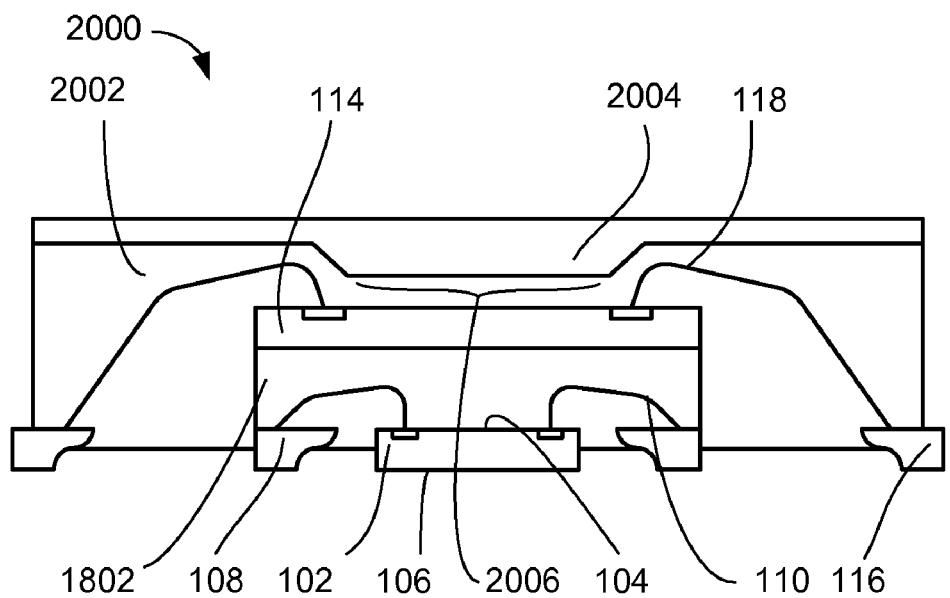
FIG. 20 is a cross-sectional view of a multiple encapsulation integrated circuit package-in-package system in a tenth embodiment of the present invention.

Referring now to FIG. 20, therein is shown a cross-sectional view of a multiple encapsulation integrated circuit package-in-package system 2000 in a tenth embodiment of the present invention.

The internal wire-in-film encapsulant 1802 encapsulates the bottom die electrical interconnects 110, and partially encapsulates the bottom integrated circuit die 102 and the internal leadfingers 108.

The internal wire-in-film encapsulant 1802 has a low viscosity and, as temperature increases, the viscosity gets lower. Therefore, the internal wire-in-film encapsulant 1802 can be easily pressed over the bottom die electrical interconnects 110 and partially pressed over the bottom integrated circuit die 102 and the internal leadfingers 108.

The top integrated circuit die 114 is attached above the internal wire-in-film encapsulant 1802 and is electrically connected to the external leadfingers 116 using the top die electrical interconnects 118. The external leadfingers 116 are placed around the periphery of the internal leadfingers 108.

An external wire-in-film encapsulant 2002 encapsulates and protects the top integrated circuit die 114, the top die electrical interconnects 118, and the external leadfingers 116. The external wire-in-film encapsulant 2002 may also be used as a thermal interface material for attaching a heat sink 2004. Thus, the external wire-in-film encapsulant 2002 serves both as an encapsulant to protect the top integrated circuit die 114, the top die electrical interconnects 118, and the external leadfingers 116 and as a thermal interface material to attach the heat sink 2004.

The heat sink 2004 having a protrusion 2006 is mounted above the external wire-in-film encapsulant 2002. The protrusion 2006 is placed in close proximity with the top integrated circuit die 114 to enhance thermal transfer from the top integrated circuit die 114 to the heat sink 2004 while maintaining a clearance between the top die electrical interconnects 118 and the heat sink 2004.

The bottom integrated circuit die 102, the internal leadfingers 108, and the external leadfingers 116 protrude downward from the internal wire-in-film encapsulant 1802 and the external wire-in-film encapsulant 2002 to provide better wettability during bonding to a printed circuit board (not shown). This exposure can be achieved by controlling how much the external wire-in-film encapsulant 2002 and the internal wire-in-film encapsulant 1802 should be pressed down or by etching a back copper leadframe.

Figure 21:
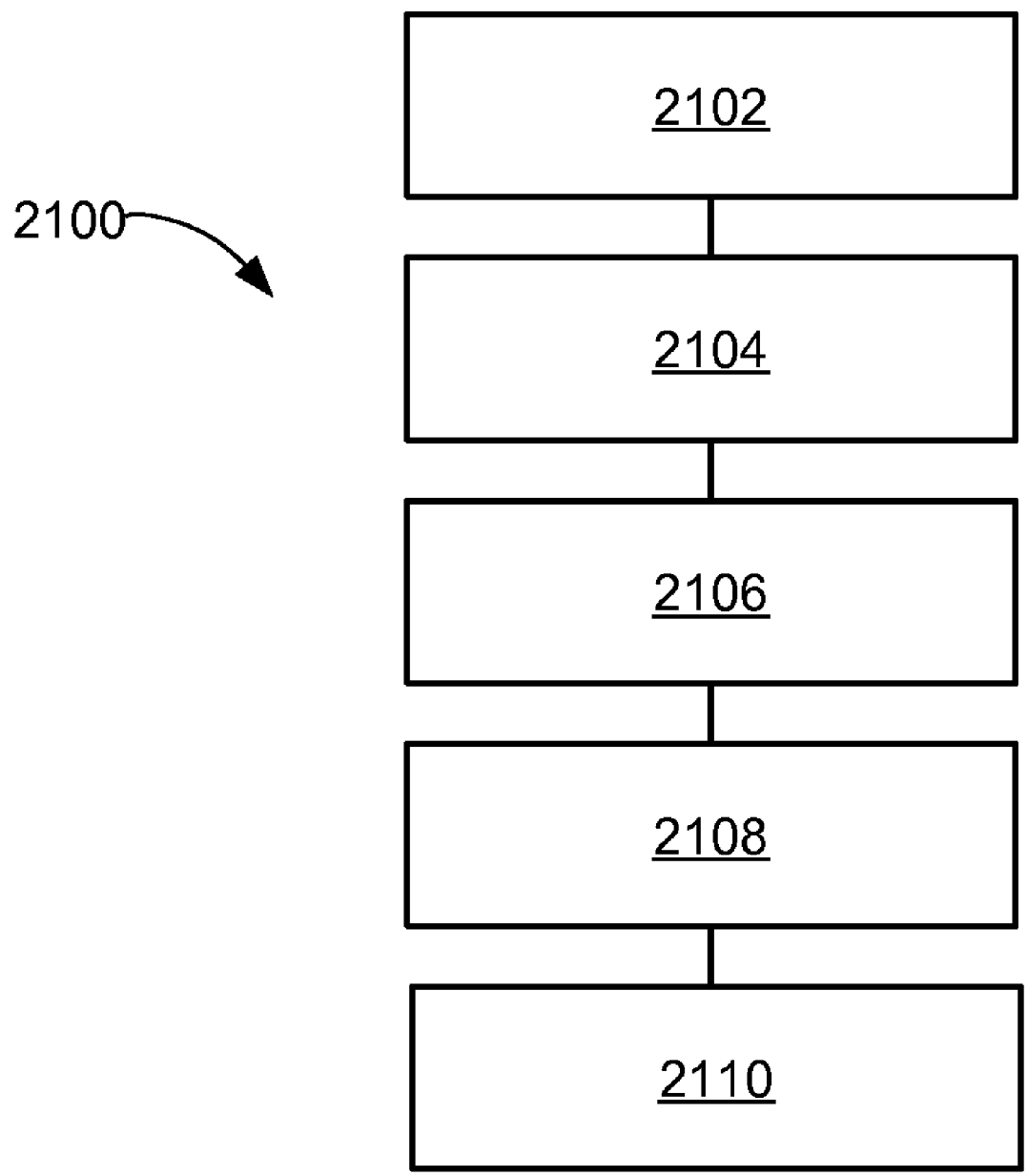
FIG. 21 is a flow chart of a multiple encapsulation integrated circuit package-in-package system for manufacturing the multiple encapsulation integrated circuit package-in-package system in an embodiment of the present invention.

Referring now to FIG. 21, therein is shown is a flow chart of a multiple encapsulation integrated circuit package-in-package system 2100 for manufacturing the multiple encapsulation integrated circuit package-in-package system 2100 in an embodiment of the present invention.

The multiple encapsulation integrated circuit package-in-package system 2100 includes: dicing a top integrated circuit wafer having a bottom encapsulant thereon to form a top integrated circuit die with the bottom encapsulant in a block 2102; positioning internal leadfingers adjacent and connected to a bottom integrated circuit die in a block 2104; pressing the bottom encapsulant on to the bottom integrated circuit die in a block 2106; connecting the top integrated circuit die to external leadfingers adjacent the internal leadfingers on the carrier in a block 2108; and forming a top encapsulant over the top integrated circuit die in a block 2110.

It has been discovered that encapsulating the bottom integrated circuit die with the internal wire-in-film encapsulant and the top integrated circuit die with the external wire-in-film encapsulant, the manufacturing process of the multiple encapsulation integrated circuit package-in-package system may be simplified since the two materials may have the same composition.

It has been discovered that with the internal wire-in-film encapsulant support from the bottom of the multiple encapsulation integrated circuit package-in-package system, wire bondability of the top integrated circuit die can be improved.

It has been found that the top integrated circuit die can be replaced by a known good package such as an internal stacking module, an interposer, a pre-molded package, or any combination of them.

It has been found that the bottom integrated circuit die can be also a pre-tested internal stacking module, pre-molded package, or any combination of them.

It has been found that it is an option to use a flip chip integrated circuit die as an interconnection method to form electrical connection between the bottom integrated circuit die and the top integrated circuit die or between the bottom integrated circuit die and the internal leadfingers, or between the top integrated circuit die and the external leadfingers.

It has been discovered that the present invention thus has numerous aspects.

Yet another important aspect of the present invention is that it valuably supports and services the historical trend of reducing costs, simplifying manufacturing process, and increasing performance.

These and other valuable aspects of the present invention consequently further the state of the technology to at least the next level.

Thus, it has been discovered that the multiple encapsulant integrated circuit package system of the present invention furnishes important and heretofore unknown and unavailable solutions, capabilities, and functional aspects for simplifying the manufacturing process for three-dimensional package-in-package systems.

The resulting processes and configurations are straightforward, cost-effective, uncomplicated, highly versatile and effective, can be surprisingly and unobviously implemented by adapting known technologies, and are thus readily suited for efficiently and economically manufacturing the three-dimensional package-in-package system.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A multiple encapsulation integrated circuit package-in-package system comprising:
   a bottom integrated circuit die;
   internal leadfingers adjacent and connected to the bottom integrated circuit die;
   a bottom encapsulant over the bottom integrated circuit die and the internal leadfingers;
   external leadfingers adjacent the internal leadfingers;
   a top integrated circuit die bonded on the bottom encapsulant connected to the external leadfingers;
   a top encapsulant over the top integrated circuit die and the bottom encapsulant; and
   a stiffener over the top encapsulant.

2. The system as claimed in claim 1 wherein the top encapsulant is a mold compound molded around the around the top integrated circuit die, the bottom encapsulant and the internal leadfingers.

3. The system as claimed in claim 1 wherein the bottom encapsulant and the top encapsulant have vertical sides.

4. The system as claimed in claim 1 further comprising a die attach paddle having the bottom integrated circuit die mounted thereon.

5. The system as claimed in claim 1 wherein the bottom encapsulant is a curable encapsulant.

6. The system as claimed in claim 5 further comprising:
an adhesive layer on the stiffener;
a buffer layer on the adhesive layer; and
wherein:
the top encapsulant is a curable encapsulant; and
the top encapsulant is bonded on to the buffer layer.

7. The system as claimed in claim 5 wherein:
the bottom encapsulant on the bottom integrated circuit die leaves a portion of the internal leadfingers extending from the bottom encapsulant; and
the internal leadfingers and the external leadfingers are interconnected.

8. The system as claimed in claim 5 wherein the stiffener includes a heat sink.

9. The system as claimed in claim 5 wherein:
the bottom encapsulant leaves portions of the bottom of the bottom integrated circuit die and the bottom of the internal leadfingers protruding; and
the top encapsulant leaves portions of the bottoms of the external leadfingers protruding.

* * * * *

UNITED STATES PATENT AND TRADEMARK OFFICE
CERTIFICATE OF CORRECTION

| | | |
|---|---|---|
| PATENT NO. | : 7,923,846 B2 | Page 1 of 1 |
| APPLICATION NO. | : 12/121752 | |
| DATED | : April 12, 2011 | |
| INVENTOR(S) | : Do et al. | |

It is certified that error appears in the above-identified patent and that said Letters Patent is hereby corrected as shown below:

Column 1:
line 4, after Title and before the Technical Field insert:

--CROSS-REFERENCE TO RELATED APPLICATION(S)

This application claims the benefit of U.S. Provisional Patent Application serial number 60/988,724 filed on November 16, 2007, and the subject matter thereof is hereby incorporated herein by reference thereto.--

Signed and Sealed this
Twenty-first Day of June, 2011

David J. Kappos
*Director of the United States Patent and Trademark Office*